(12) United States Patent
Lei et al.

(10) Patent No.: US 11,835,595 B2
(45) Date of Patent: Dec. 5, 2023

(54) CHIP AND CHIP TESTING METHOD

(71) Applicant: Shanghai Biren Technology Co., Ltd, Shanghai (CN)

(72) Inventors: Kai Lei, Shanghai (CN); Yikai Liang, Shanghai (CN); Yudan Deng, Shanghai (CN); Linglan Zhang, Shanghai (CN); Jinfu Ye, Shanghai (CN); Huan Liu, Shanghai (CN)

(73) Assignee: Shanghai Biren Technology Co., Ltd, Shanghai (CN)

( * ) Notice: Subject to any disclaimer, the term of this patent is extended or adjusted under 35 U.S.C. 154(b) by 1 day.

(21) Appl. No.: 17/885,549

(22) Filed: Aug. 11, 2022

(65) Prior Publication Data

US 2023/0176141 A1 Jun. 8, 2023

(30) Foreign Application Priority Data

Dec. 3, 2021 (CN) .......................... 202111461009.9

(51) Int. Cl.
*G01R 31/52* (2020.01)
*G01R 31/28* (2006.01)
*H01L 21/66* (2006.01)

(52) U.S. Cl.
CPC .......... *G01R 31/52* (2020.01); *G01R 31/2884* (2013.01); *H01L 22/34* (2013.01)

(58) Field of Classification Search
CPC .............. G01R 31/52; G01R 31/2884; G01R 31/3167; G01R 31/2851; H01L 22/34
(Continued)

(56) References Cited

U.S. PATENT DOCUMENTS 7,276,926 B2 * 10/2007 Farnworth ............. G01R 31/52
365/201
2006/0059395 A1 * 3/2006 Su ...................... G01R 31/2884
714/726
(Continued)

FOREIGN PATENT DOCUMENTS

CN 101471142 7/2009
CN 105790765 7/2016
(Continued)

OTHER PUBLICATIONS

"Office Action of Taiwan Counterpart Application", dated Nov. 8, 2022, p. 1-p. 4.

*Primary Examiner* — Giovanni Astacio-Oquendo
(74) *Attorney, Agent, or Firm* — JCIP GLOBAL INC.

(57) ABSTRACT

A chip and a chip testing method are provided. The chip includes a sending terminal circuit and a test circuit. The sending terminal circuit includes a signal sending unit and a first signal bump. The first signal bump is coupled to the signal sending unit. The test circuit is coupled to a circuit node between the signal sending unit and the first signal bump. The test circuit includes a first resistor, a unit gain buffer, and an analog-to-digital converter. A first terminal of the first resistor is coupled to the circuit node. A first input terminal of the unit gain buffer is coupled to a second terminal of the first resistor. A second input terminal of the unit gain buffer is coupled to an output terminal of the unit gain buffer. An input terminal of the analog-to-digital converter is coupled to the output terminal of the unit gain buffer.

20 Claims, 8 Drawing Sheets

(58) Field of Classification Search
USPC .................................... 324/750.3, 537, 500
See application file for complete search history.

(56) References Cited

U.S. PATENT DOCUMENTS

2010/0117678 A1* 5/2010 Nakabayashi ..... G01R 31/2884
　　　　　　　　　　　　　　　　　　　　　257/E23.002
2020/0233039 A1　　7/2020 Jorgensen et al.

FOREIGN PATENT DOCUMENTS

| JP | H1054806 | 2/1998 |
| TW | 380207 | 1/2000 |
| TW | 201802795 | 1/2018 |

* cited by examiner

CHIP AND CHIP TESTING METHOD

CROSS-REFERENCE TO RELATED APPLICATION

This application claims the priority benefit of China application serial no. 202111461009.9, filed on Dec. 3, 2021. The entirety of the above-mentioned patent application is hereby incorporated by reference herein and made a part of this specification.

BACKGROUND

Technical Field

The disclosure relates to a testing technology, and in particular, to a chip and a chip testing method.

Description of Related Art

As the computational requirements for chips grow, the bandwidth and latency requirements for a system on a chip (SOC) increase, and the speed of the serializer/deserializer (SERDES) protocol is also required to be accelerated. In this regard, in a conventional chip, a signal bump with a large area is required be designed at the sending terminal of the chip to meet the requirements of design for testability (DFT) in the manufacturing process of the high-speed chip, so as to allow the related electrical testing to be performed. It thus can be seen that in a conventional chip, the sending terminal circuit usually occupies a large area of signal bumps. The circuit space may thus be wasted, and the influence caused by parasitic capacitance may also be significant.

SUMMARY

The disclosure provides a chip and a chip testing method through which effective electrical testing at a signal sending terminal of the chip may be achieved.

The disclosure provides a chip including a sending terminal circuit and a test circuit. The sending terminal circuit includes a signal sending unit and a first signal bump. The first signal bump is coupled to the signal sending unit. The test circuit is coupled to a circuit node between the signal sending unit and the first signal bump. The test circuit includes a first resistor, a unit gain buffer, and an analog-to-digital converter. A first terminal of the first resistor is coupled to the circuit node. A first input terminal of the unit gain buffer is coupled to a second terminal of the first resistor. A second input terminal of the unit gain buffer is coupled to an output terminal of the unit gain buffer. An input terminal of the analog-to-digital converter is coupled to the output terminal of the unit gain buffer.

The disclosure further provides a chip testing method suitable for chip testing. The chip includes a sending terminal circuit and a test circuit. The sending terminal circuit includes a signal sending unit and a first signal bump. The signal sending unit is coupled to the first signal bump. The test circuit is coupled to a circuit node between the signal sending unit and the first signal bump. The test circuit includes a first resistor, a unit gain buffer, and an analog-to-digital converter. A first terminal of the first resistor is coupled to the circuit node. A first input terminal of the unit gain buffer is coupled to a second terminal of the first resistor. A second input terminal of the unit gain buffer is coupled to an output terminal of the unit gain buffer. An input terminal of the analog-to-digital converter is coupled to the output terminal of the unit gain buffer. The chip testing method includes the following steps. When the signal sending unit outputs a first direct current (DC) level test signal, the first input terminal of the unit gain buffer receives the first DC level test signal through the second terminal of the first resistor. The output terminal of the unit gain buffer outputs a second DC level test signal to the input terminal of the analog-to-digital converter. An output terminal of the analog-to-digital converter outputs a first digital test signal.

To sum up, in the chip and the chip testing method provided by the disclosure, the test circuit may be arranged to be disposed at the signal sending terminal in the chip, and effective electrical testing at the signal sending terminal may be achieved in this way.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
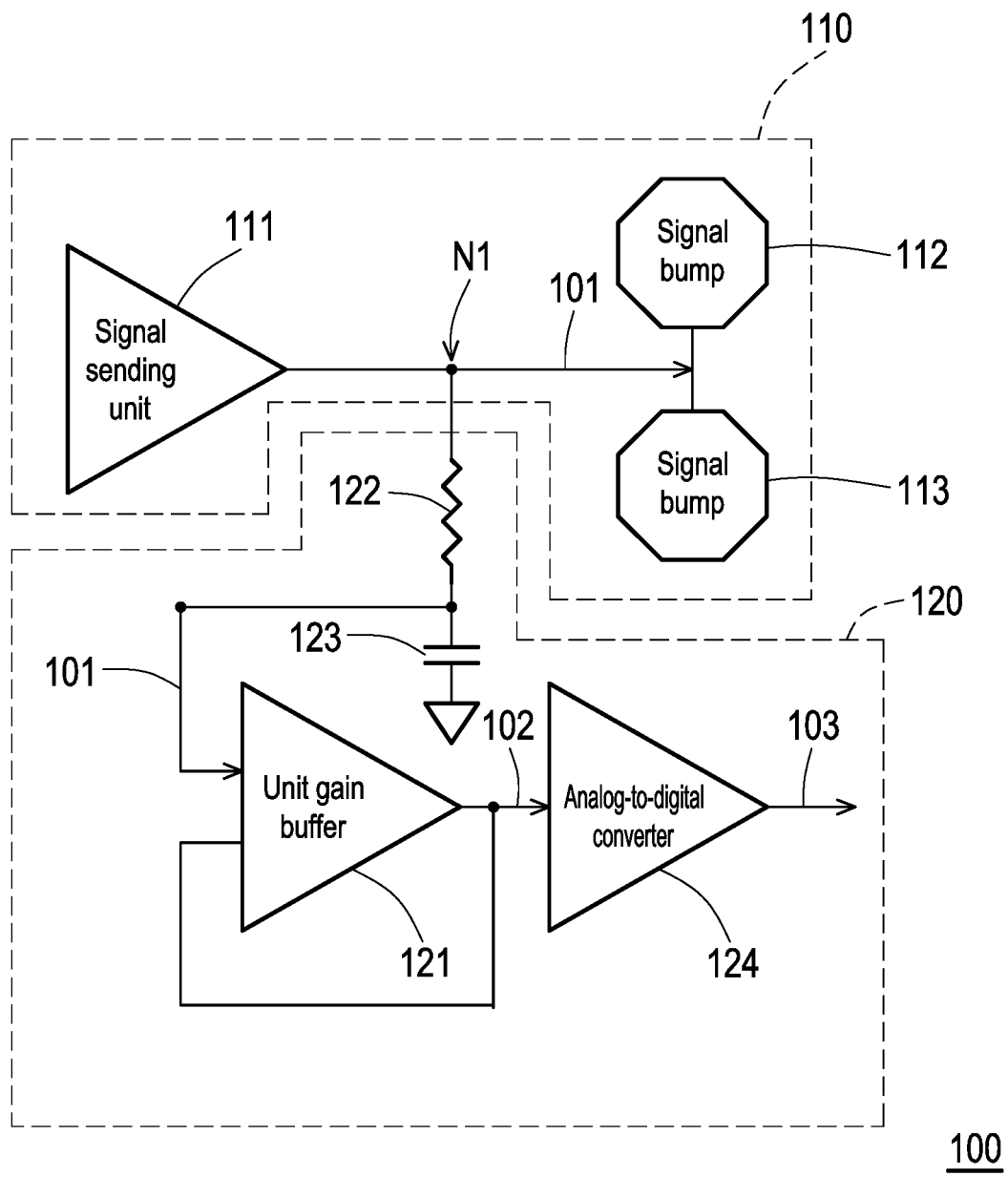
FIG. 1 is a schematic circuit diagram of a chip according to a first embodiment of the disclosure.

Descriptions of the disclosure are given with reference to the exemplary embodiments illustrated by the accompanying drawings. Wherever possible, the same reference numbers are used in the drawings and the description to refer to the same or like parts.

FIG. 1 is a schematic circuit diagram of a chip according to a first embodiment of the disclosure. With reference to FIG. 1, a chip 100 includes a sending terminal circuit 110 and a test circuit 120. The test circuit 120 may perform electrical testing on the sending terminal circuit 110. In this embodiment, the sending terminal circuit 110 includes a signal sending unit 111 and signal bump 112 and 113. The signal sending unit 111 may include a driver circuit. The signal sending unit 111 is coupled to the signal bumps 112 and 113. In some embodiments of the disclosure, the sending terminal circuit 110 may include one signal bump or a plurality of signal bumps, and it is not limited to what is shown in FIG. 1. In this embodiment, the test circuit 120 is coupled to a circuit node N1 between the signal sending unit 111 and the signal bumps 112 and 113. The test circuit 120 includes a unit gain buffer 121 (or referred to as a voltage follower), a first resistor 122, a capacitor 123, and an analog-to-digital converter (ADC) 124. A first terminal of the first resistor 122 is coupled to the circuit node N1. A first input terminal of the unit gain buffer 121 is coupled to a second terminal of the first resistor 122. A second input terminal of the unit gain buffer 121 is coupled to an output terminal of the unit gain buffer 121. An input terminal of the analog-to-digital converter 124 is coupled to the output terminal of the unit gain buffer 121. A first terminal of the capacitor 123 is coupled to the second terminal of the first resistor 122. A second terminal of the capacitor 123 is coupled to a reference voltage (e.g., a ground terminal voltage).

In this embodiment, the first resistor 122 may be a large resistor, for example, having 1K ohm. The first resistor 122 may be used to isolate the sending terminal circuit 110 and the test circuit 120. The capacitor 123 may filter a signal transmitted from the circuit node N1 of the sending terminal circuit 110 to the test circuit 120 to filter out noise. In this embodiment, the test circuit 120 may operate in a direct current (DC) level test mode, so as to receive a first DC level test signal 101 outputted by the signal sending unit 111 of the sending terminal circuit 110 and to generate a corresponding test signal for analysis by a related processing circuit in the chip 100 or an external signal test device.

Figure 2:
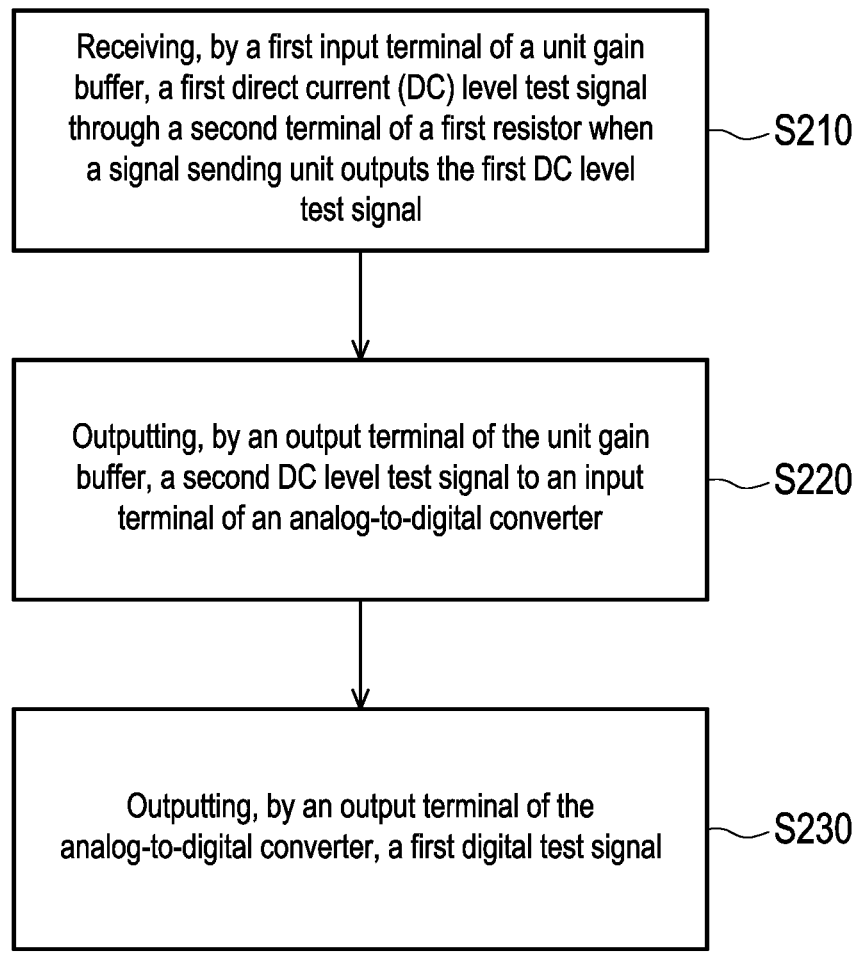
FIG. 2 is a flow chart of a chip testing method according to the first embodiment of the disclosure.

FIG. 2 is a flow chart of a chip testing method according to the first embodiment of the disclosure. With reference to FIG. 1 and FIG. 2, the chip 100 may perform the following steps S210 to S230 to achieve DC level testing. In step S210, when the signal sending unit 111 outputs the first DC level test signal 101 (determines the DC level for testing), the first input terminal of the unit gain buffer 121 receives the first DC level test signal 101 through the second terminal of the first resistor 122. In this embodiment, the first DC level test signal 101 is an analog signal. In step S220, the output terminal of the unit gain buffer 121 outputs a second DC level test signal 102 to the input terminal of the analog-to-digital converter 124. Herein, the output terminal of the rail-to-rail unit gain buffer 121 may output the second DC level test signal 102 exhibiting low noise and good linearity characteristics. In step S230, an output terminal of the analog-to-digital converter 124 outputs a first digital test signal 103. In this embodiment, the analog-to-digital converter 124 may convert the analog second DC level test signal 102 into the first digital test signal 103, so that the related processing circuit in the chip 100 or an external signal test device may analyze the digital test signal 103, so as to obtain an electrical test result related to the DC level test signal of the sending terminal circuit 110 of the chip 100.

In addition, in some embodiments of the disclosure, in the DC level test mode, the signal sending unit 111 may be configured to output a differential signal. In other words, the signal sending unit 111 may include a first output terminal and a second output terminal. The first output terminal of the signal sending unit 111 may be coupled to the signal bumps 112 and 113 through the circuit node N1, and the second output terminal of the signal sending unit 111 is coupled to at least another first signal bump through another circuit node. The chip 100 may further include another test circuit (having the same circuit configuration as the test circuit 120), and the another test circuit is coupled to the another circuit node. In this way, the first output terminal and the second output terminal of the signal sending unit 111 may output a differential test signal, and the DC level testing may be separately performed through different test circuits.

Figure 3:
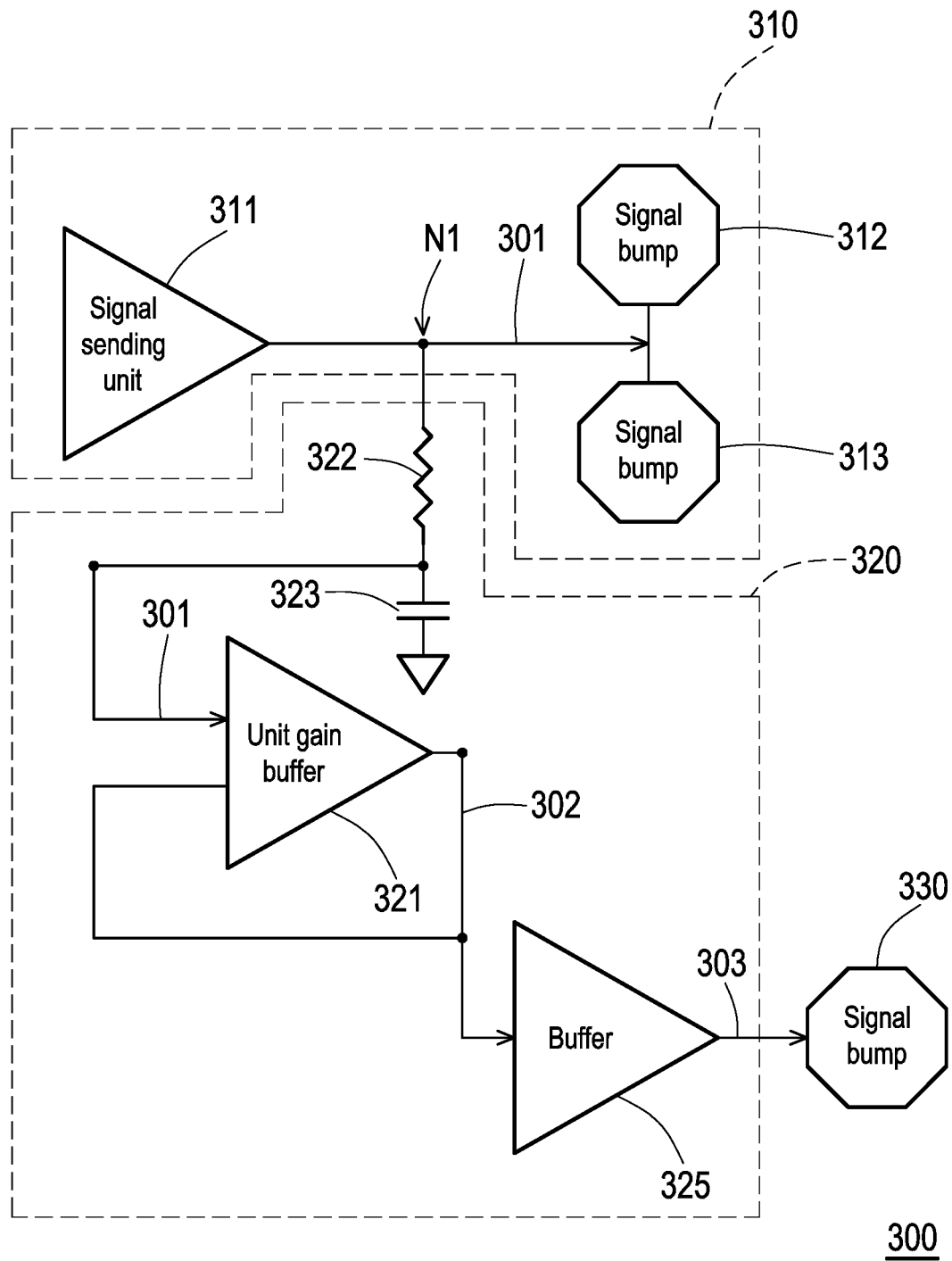
FIG. 3 is a schematic circuit diagram of a chip according to a second embodiment of the disclosure.

FIG. 3 is a schematic circuit diagram of a chip according to a second embodiment of the disclosure. With reference to FIG. 3, a chip 300 includes a sending terminal circuit 310 and a test circuit 320. The test circuit 320 may perform electrical testing on the sending terminal circuit 310. In this embodiment, the sending terminal circuit 310 includes a signal sending unit 311 and signal bump 312 and 313. The signal sending unit 311 may include a driver circuit. The signal sending unit 311 is coupled to the signal bumps 312 and 313. In some embodiments of the disclosure, the sending terminal circuit 310 may include one signal bump or a plurality of signal bumps, and it is not limited to what is shown in FIG. 3. In this embodiment, the test circuit 320 is coupled to a circuit node N1 between the signal sending unit 311 and the signal bumps 312 and 313. The test circuit 320 includes a unit gain buffer 321, a first resistor 322, a capacitor 323, and a buffer 325. A first terminal of the first resistor 322 is coupled to the circuit node N1. A first input terminal of the unit gain buffer 321 is coupled to a second terminal of the first resistor 322. A second input terminal of the unit gain buffer 321 is coupled to an output terminal of the unit gain buffer 321. An input terminal of the buffer 325 is coupled to the output terminal of the unit gain buffer 321. An output terminal of the buffer 325 is coupled to a signal bump 330. The signal bump 330 may be coupled to a general purpose input output pin (GPIO) of the chip 300. A first terminal of the capacitor 323 is coupled to the second terminal of the first resistor 322. A second terminal of the capacitor 323 is coupled to a reference voltage (e.g., a ground terminal voltage).

In this embodiment, some circuit elements in the sending terminal circuit 310 and the test circuit 320 are the same as those in FIG. 1, so that description of these circuit elements may be found with reference to the description of the embodiments of FIG. 1 and thus is not repeated herein. In this embodiment, the test circuit 320 may operate in an analog signal test mode, so as to receive a first analog test signal 301 outputted by the signal sending unit 311 of the sending terminal circuit 310 and to generate a corresponding test signal for analysis by a related processing circuit in the chip 300 or an external signal test device. It should be noted that the first analog test signal 301 in this embodiment may be a low-speed CMOS signal.

Figure 4:
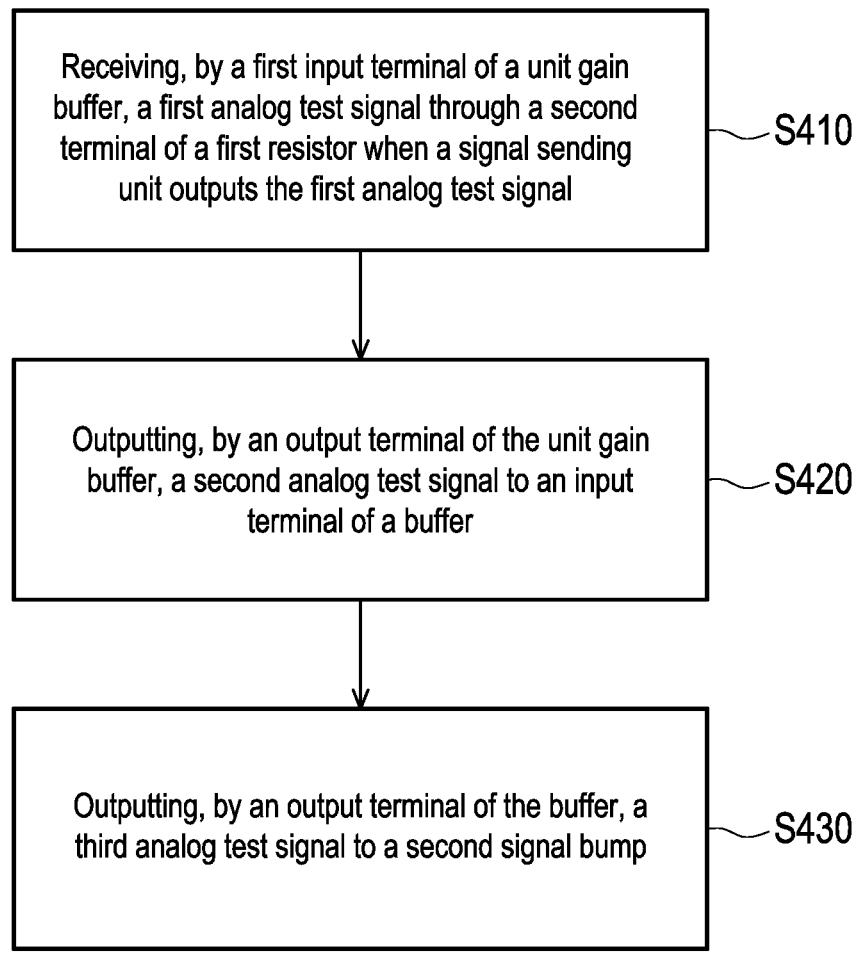
FIG. 4 is a flow chart of a chip testing method according to the second embodiment of the disclosure.

FIG. 4 is a flow chart of a chip testing method according to the second embodiment of the disclosure. With reference to FIG. 3 and FIG. 4, the chip 300 may perform the following steps S410 to S430 to achieve low-speed CMOS signal testing. In step S410, when the signal sending unit 311 outputs the first analog test signal 301, the first input terminal of the unit gain buffer 321 receives the first analog test signal 301 through the second terminal of the first resistor 322. In step S420, the output terminal of the unit gain buffer 322 outputs a second analog test signal 302 to the input terminal of the buffer 325. Herein, the output terminal of the rail-to-rail unit gain buffer 321 may output the second analog test signal 302 exhibiting low noise and good linearity characteristics. In step S430, the output terminal of the buffer 325 outputs a third analog test signal 303 to the signal bump 330. In this embodiment, the signal bump 330 may be coupled to an external signal test device, so that the external signal test device may receive the third analog test signal 303 for signal analysis, so as to obtain an electrical test result related to the analog signal of the sending terminal circuit 310 of the chip 300.

In addition, in some embodiments of the disclosure, in the analog signal test mode, the signal sending unit 311 may be configured to output a differential signal. In other words, the signal sending unit 311 may include a first output terminal and a second output terminal. The first output terminal of the signal sending unit 311 may be coupled to the signal bumps 312 and 313 through the circuit node N1, and the second output terminal of the signal sending unit 311 is coupled to at least another first signal bump through another circuit node. The chip 300 may further include another test circuit (having the same circuit configuration as the test circuit 320), and the another test circuit is coupled to the another circuit node. In this way, the first output terminal and the second output terminal of the signal sending unit 311 may output a differential test signal, and the analog signal testing may be separately performed through different test circuits.

Figure 5:
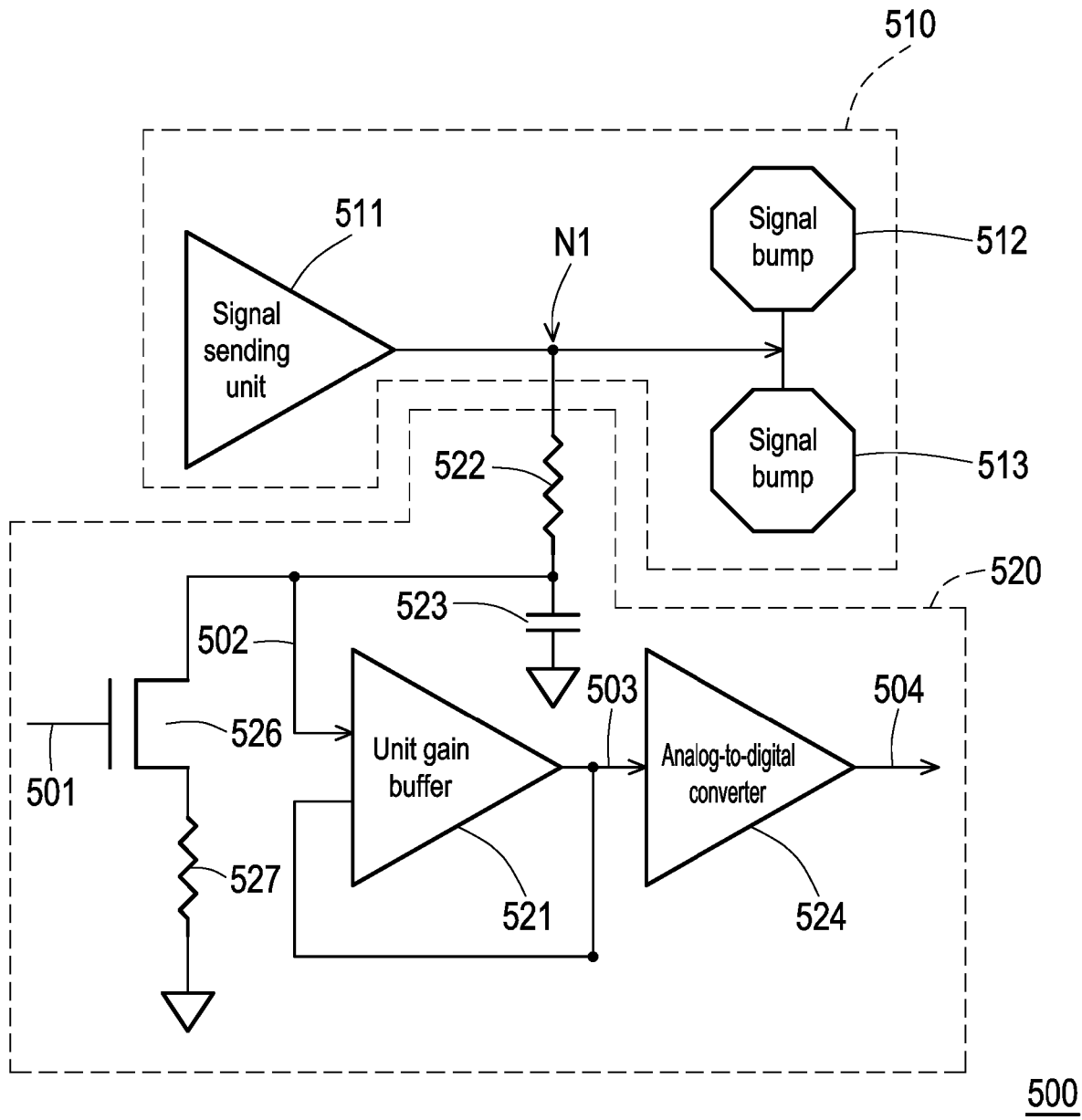
FIG. 5 is a schematic circuit diagram of a chip according to a third embodiment of the disclosure.

FIG. 5 is a schematic circuit diagram of a chip according to a third embodiment of the disclosure. With reference to FIG. 5, a chip 500 includes a sending terminal circuit 510 and a test circuit 520. The test circuit 520 may perform electrical testing on the sending terminal circuit 510. In this embodiment, the sending terminal circuit 510 includes a signal sending unit 511 and signal bump 512 and 513. The signal sending unit 511 may include a driver circuit. The signal sending unit 511 is coupled to the signal bumps 512 and 513. In some embodiments of the disclosure, the sending terminal circuit 510 may include one signal bump or a plurality of signal bumps, and it is not limited to what is shown in FIG. 5. In this embodiment, the test circuit 520 is coupled to a circuit node N1 between the signal sending unit 511 and the signal bumps 512 and 513. The test circuit 520 includes a unit gain buffer 521, a first resistor 522, a capacitor 523, an analog-to-digital converter 524, a switch circuit 526, and a second resistor 527. A first terminal of the first resistor 522 is coupled to the circuit node N1. A first input terminal of the unit gain buffer 521 is coupled to a second terminal of the first resistor 522. A second input terminal of the unit gain buffer 521 is coupled to an output terminal of the unit gain buffer 521. An input terminal of the analog-to-digital converter 524 is coupled to the output terminal of the unit gain buffer 521. A first terminal of the capacitor 523 is coupled to the second terminal of the first resistor 522. A second terminal of the capacitor 523 is coupled to a reference voltage (e.g., a ground terminal voltage). A first terminal of the switch circuit 526 is coupled to the second terminal of the first resistor 522. A first terminal of the second resistor 527 is coupled to a second terminal of the switch circuit 526. A second terminal of the second resistor 527 is coupled to the reference voltage (e.g., the ground terminal voltage). In this embodiment, the switch circuit 526 is a switch transistor, but the disclosure is not limited thereto.

In this embodiment, some circuit elements in the sending terminal circuit 510 and the test circuit 520 are the same as those in FIG. 1, so that description of these circuit elements may be found with reference to the description of the embodiments of FIG. 1 and thus is not repeated herein. In this embodiment, the test circuit 520 may operate in a leakage current test mode, so as to detect a leakage current generated by the sending terminal circuit 510 and to generate a corresponding test signal for analysis by a related processing circuit in the chip 500 or an external signal test device.

Figure 6:
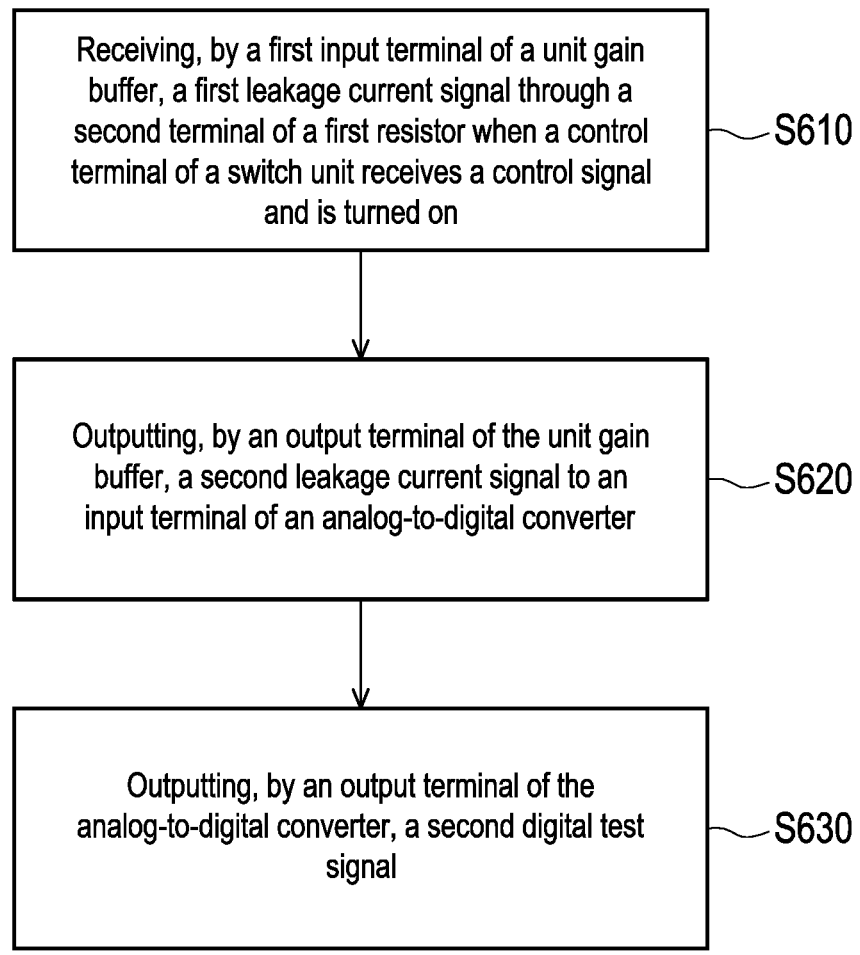
FIG. 6 is a flow chart of a chip testing method according to the third embodiment of the disclosure.

FIG. 6 is a flow chart of a chip testing method according to the third embodiment of the disclosure. With reference to FIG. 5 and FIG. 6, the chip 500 may perform the following steps S610 to S630 to achieve leakage current testing. In step S610, when a control terminal of the switch circuit 526 receives a control signal 501 and is turned on, the first input terminal of the unit gain buffer 521 receives a first leakage current signal 502 through the second terminal of the first resistor 522. The control signal 501 is a voltage signal. Further, note that the first leakage current signal 502 refers to a cross-voltage result generated by a leakage current flowing from the circuit node N1 through the switch circuit 526 and the second resistor 527 on the second resistor 527. The first leakage current signal 502 is a signal representing magnitude of a voltage value of the leakage current. In step S620, the output terminal of the unit gain buffer 521 outputs a second leakage current signal 503 to the input terminal of the analog-to-digital converter 524. Herein, the output terminal of the rail-to-rail unit gain buffer 521 may output the second leakage current signal 503 exhibiting low noise and good linearity characteristics. In step S630, an output terminal of the analog-to-digital converter 524 outputs a second digital test signal 504. In this embodiment, the analog-to-digital converter 524 may convert the analog second leakage current signal 503 into the second digital test signal 504, so that the related processing circuit in the chip 500 or an external signal test device may analyze the second digital test signal 504, so as to obtain an electrical test result related to the leakage current of the sending terminal circuit 510 of the chip 500.

Note that the second digital test signal 504 is a reading outputted by the analog-to-digital converter 524, which may be a voltage value. Therefore, the leakage value may be obtained by dividing the voltage value by a resistance value of the second resistor 527.

In addition, in some embodiments of the disclosure, in the leakage current test mode, the signal sending unit 511 may be configured to output a common mode test signal. In other words, the signal sending unit 511 may include a first output terminal and a second output terminal. The first output terminal of the signal sending unit 511 may be coupled to the signal bumps 512 and 513 through the circuit node N1, and the second output terminal of the signal sending unit 511 is coupled to at least another first signal bump through another circuit node. The chip 500 may further include another test circuit (having the same circuit configuration as the test circuit 520), and the another test circuit is coupled to the another circuit node. In this way, the first output terminal and the second output terminal of the signal sending unit 511 may output a common mode test signal, and the leakage current testing may be separately performed through different test circuits.

Besides, the test circuit 520 of the chip 500 of this embodiment may further perform steps S210 to S230 as described in the embodiments of FIG. 2 to achieve DC level testing. The chip 500 of this embodiment may be executed selectively in the DC level test mode or the leakage current test mode. The description of the DC level test mode may be found with reference to the description of the embodiments of FIG. 1 and FIG. 2 and thus is not repeated herein.

Figure 7:
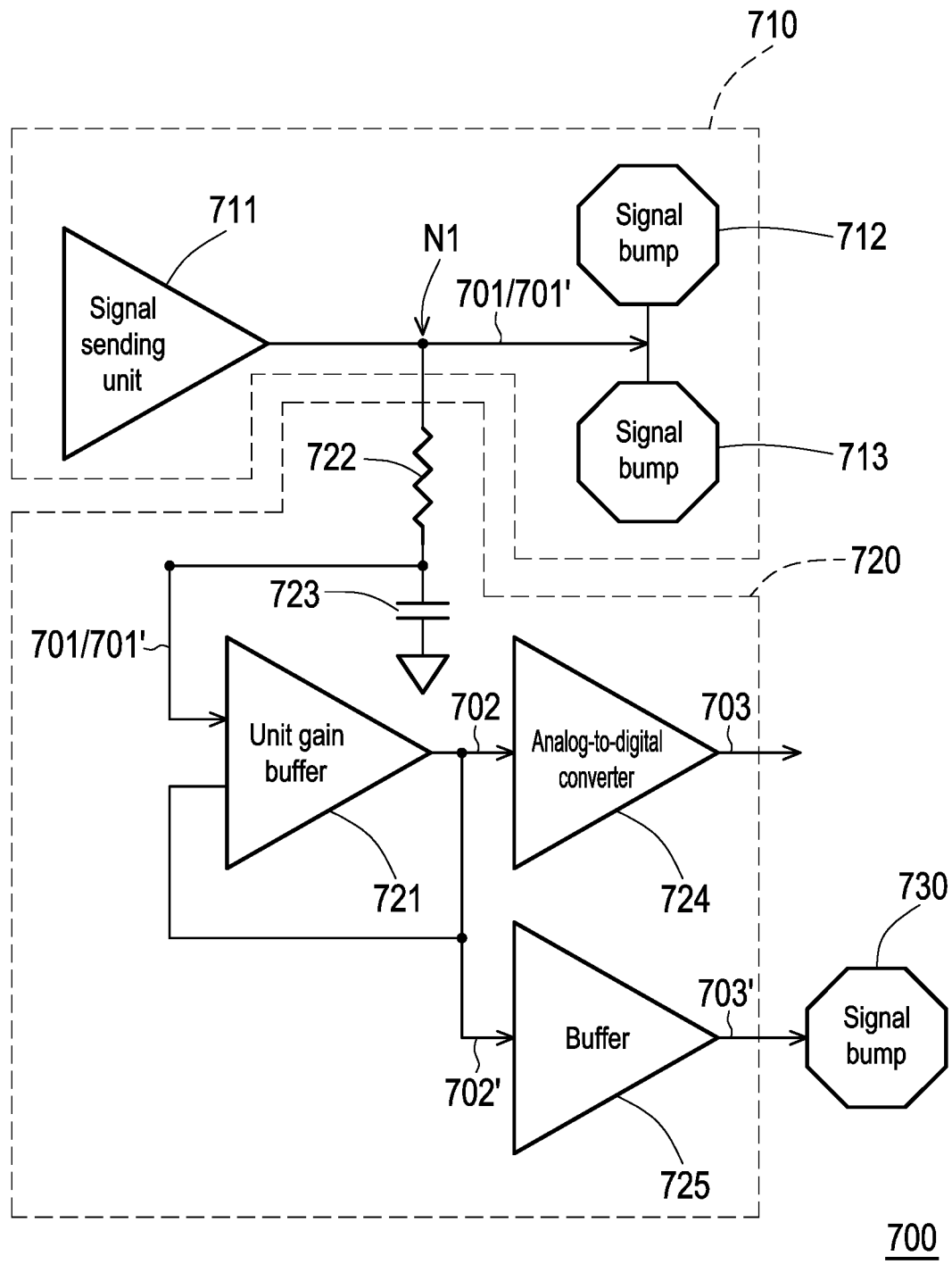
FIG. 7 is a schematic circuit diagram of a chip according to a fourth embodiment of the disclosure.

FIG. 7 is a schematic circuit diagram of a chip according to a fourth embodiment of the disclosure. With reference to FIG. 7, a chip 700 includes a sending terminal circuit 710 and a test circuit 720. The test circuit 720 may perform electrical testing on the sending terminal circuit 710. In this embodiment, the sending terminal circuit 710 includes a signal sending unit 711 and signal bump 712 and 713. The signal sending unit 711 may include a driver circuit. The signal sending unit 711 is coupled to the signal bumps 712 and 713. In some embodiments of the disclosure, the sending terminal circuit 710 may include one signal bump or a plurality of signal bumps, and it is not limited to what is shown in FIG. 7. In this embodiment, the test circuit 720 is coupled to a circuit node N1 between the signal sending unit 711 and the signal bumps 712 and 713. The test circuit 720 includes a unit gain buffer 721, a first resistor 722, a capacitor 723, an analog-to-digital converter 724, and a buffer 725. A first terminal of the first resistor 722 is coupled to the circuit node N1. A first input terminal of the unit gain buffer 721 is coupled to a second terminal of the first resistor 722. A second input terminal of the unit gain buffer 721 is coupled to an output terminal of the unit gain buffer 721. An input terminal of the analog-to-digital converter 724 is coupled to the output terminal of the unit gain buffer 721. An input terminal of the buffer 725 is coupled to the output terminal of the unit gain buffer 721. An output terminal of the buffer 725 is coupled to a signal bump 730. The signal bump 730 may be coupled to a general purpose input output pin of the chip 700. A first terminal of the capacitor 723 is coupled to the second terminal of the first resistor 722. A second terminal of the capacitor 723 is coupled to a reference voltage (e.g., a ground terminal voltage).

In this embodiment, some circuit elements in the sending terminal circuit 710 and the test circuit 720 are the same as those in FIG. 1 and FIG. 3, so that description of these circuit elements may be found with reference to the description of the embodiments of FIG. 1 and FIG. 3 and thus is not repeated herein.

Note that the test circuit 720 of the chip 700 of this embodiment may perform steps S210 to S230 as described in the embodiments of FIG. 2 to achieve DC level testing or may perform steps S410 to S430 as described in the embodiments of FIG. 4 to achieve analog signal testing. The chip 700 of this embodiment may be executed selectively in the DC level test mode or the analog signal test mode.

In the DC level test mode, when the signal sending unit 711 outputs a first DC level test signal 701 (determines the DC level for testing), the first input terminal of the unit gain buffer 721 receives the first DC level test signal 701 through the second terminal of the first resistor 722. In this embodiment, the first DC level test signal 701 is an analog signal. The output terminal of the unit gain buffer 721 outputs a second DC level test signal 702 to the input terminal of the analog-to-digital converter 724. Herein, the output terminal of the rail-to-rail unit gain buffer 721 may output the second DC level test signal 702 exhibiting low noise and good linearity characteristics. An output terminal of the analog-to-digital converter 724 outputs a first digital test signal 703. In this embodiment, the analog-to-digital converter 724 may convert the analog second DC level test signal 702 into the first digital test signal 703, so that a related processing circuit in the chip 700 or an external signal test device may analyze the digital test signal 703, so as to obtain an electrical test result related to the DC level test signal of the sending terminal circuit 710 of the chip 700.

In the analog signal test mode, when the signal sending unit 711 outputs a first analog test signal 701', the first input terminal of the unit gain buffer 721 receives the first analog test signal 701' through the second terminal of the first resistor 722. The output terminal of the unit gain buffer 722 outputs a second analog test signal 702' to the input terminal of the buffer 725. Herein, the output terminal of the rail-to-rail unit gain buffer 721 may output the second analog test signal 702' exhibiting low noise and good linearity characteristics. The output terminal of the buffer 725 outputs a third analog test signal 703' to the signal bump 730. In this embodiment, the signal bump 730 may be coupled to an external signal test device, so that the external signal test device may receive the third analog test signal 703' for signal analysis, so as to obtain an electrical test result related to the analog signal of the sending terminal circuit 710 of the chip 700.

Specific implementation of the DC level test mode may be found with reference to the description of the embodiments of FIG. 1 and FIG. 2, specific implementation of the analog signal test mode may be found with reference to the description of the embodiments of FIG. 3 and FIG. 4, and description thereof is thus not repeated herein.

Figure 8:
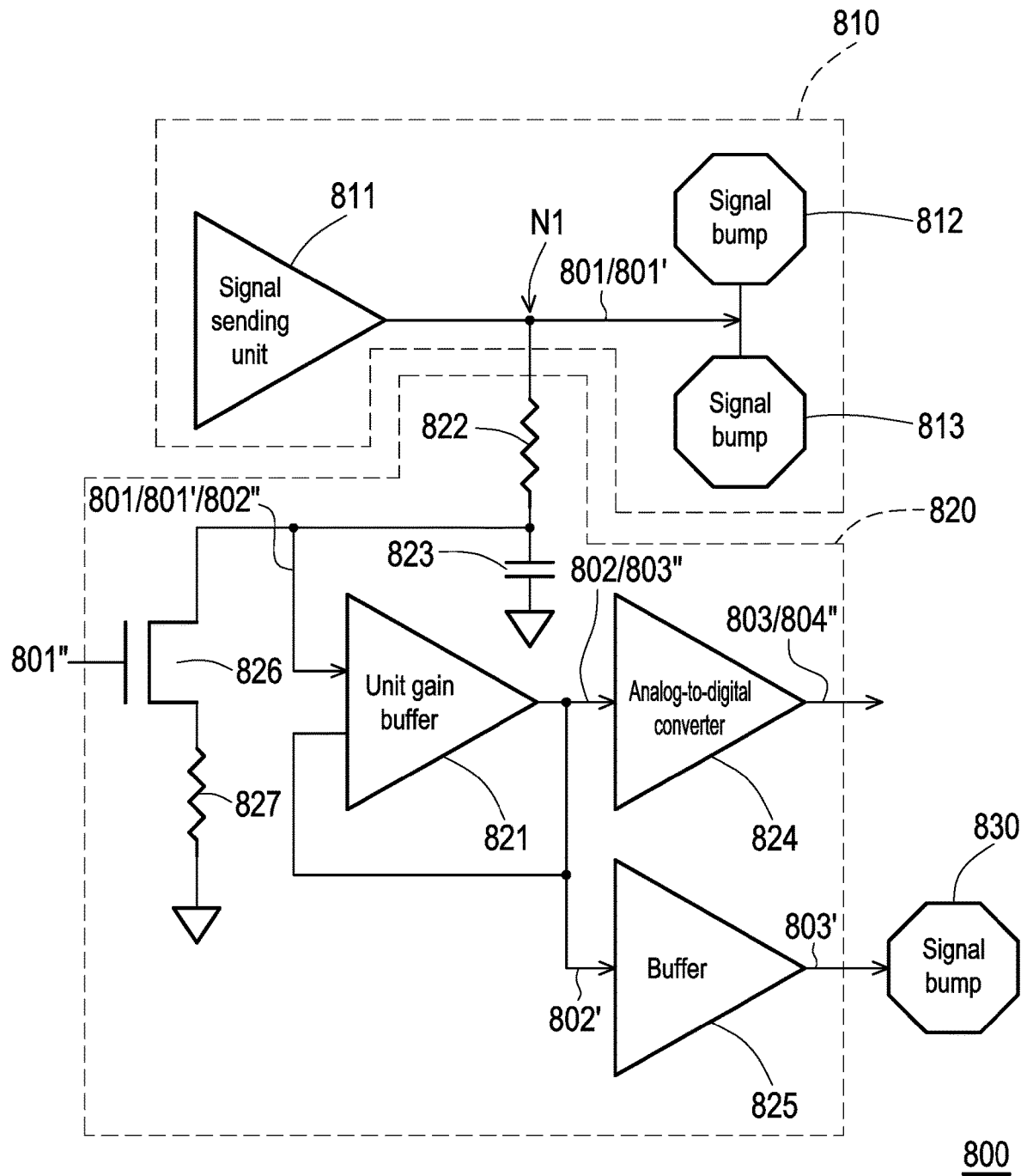
FIG. 8 is a schematic circuit diagram of a chip according to a fifth embodiment of the disclosure.

FIG. 8 is a schematic circuit diagram of a chip according to a fifth embodiment of the disclosure. With reference to FIG. 8, a chip 800 includes a sending terminal circuit 810 and a test circuit 820. The test circuit 820 may perform electrical testing on the sending terminal circuit 810. In this embodiment, the sending terminal circuit 810 includes a signal sending unit 811 and signal bump 812 and 813. The signal sending unit 811 may include a driver circuit. The signal sending unit 811 is coupled to the signal bumps 812 and 813. In some embodiments of the disclosure, the sending terminal circuit 810 includes one signal bump or a plurality of signal bumps, and it is not limited to what is shown in FIG. 8. In this embodiment, the test circuit 820 is coupled to a circuit node N1 between the signal sending unit 811 and the signal bumps 812 and 813. The test circuit 820 includes a unit gain buffer 821, a first resistor 822, a capacitor 823, an analog-to-digital converter 824, a buffer 825, a switch circuit 826, and a second resistor 827. A first terminal of the first resistor 822 is coupled to the circuit node N1. A first input terminal of the unit gain buffer 821 is coupled to a second terminal of the first resistor 822. A second input terminal of the unit gain buffer 821 is coupled to an output terminal of the unit gain buffer 821. An input terminal of the analog-to-digital converter 824 is coupled to the output terminal of the unit gain buffer 821. An input terminal of the buffer 825 is coupled to the output terminal of the unit gain buffer 821. An output terminal of the buffer 825 is coupled to a signal bump 830. The signal bump 830 may be coupled to a general purpose input output pin of the chip 800. A first terminal of the capacitor 823 is coupled to the second terminal of the first resistor 822. A second terminal of the capacitor 823 is coupled to a reference voltage (e.g., a ground terminal voltage). A first terminal of the switch circuit 826 is coupled to the second terminal of the first resistor 822. A first terminal of the second resistor 827 is coupled to a second terminal of the switch circuit 826. A second terminal of the second resistor 827 is coupled to the reference voltage (e.g., the ground terminal voltage). In this embodiment, the switch circuit 826 is a switch transistor, but the disclosure is not limited thereto.

In this embodiment, some circuit elements in the sending terminal circuit 810 and the test circuit 820 are the same as those in FIG. 1, FIG. 3, and FIG. 5, so that description of these circuit elements may be found with reference to the description of the embodiments of FIG. 1, FIG. 3, and FIG. 5 and thus is not repeated herein.

Note that the test circuit 820 of the chip 800 of this embodiment may perform steps S210 to S230 as described in the embodiments of FIG. 2 to achieve DC level testing, may perform steps S410 to S430 as described in the embodiments of FIG. 4 to achieve analog signal testing, or may perform steps S610 to S630 as described in the embodiments of FIG. 6 to achieve leakage current testing. The chip 800 of this embodiment may be executed selectively in the DC level test mode, the analog signal test mode, or the leakage current test mode.

In the DC level test mode, when the signal sending unit 811 outputs a first DC level test signal 801 (determines the DC level for testing), the first input terminal of the unit gain buffer 821 receives the first DC level test signal 801 through the second terminal of the first resistor 822. In this embodiment, the first DC level test signal 801 is an analog signal. The output terminal of the unit gain buffer 821 outputs a second DC level test signal 802 to the input terminal of the analog-to-digital converter 724. Herein, the output terminal of the rail-to-rail unit gain buffer 821 may output the second DC level test signal 802 exhibiting low noise and good linearity characteristics. An output terminal of the analog-to-digital converter 824 outputs a first digital test signal 803. In this embodiment, the analog-to-digital converter 824 may convert the analog second DC level test signal 802 into the first digital test signal 803, so that the related processing circuit in the chip 800 or an external signal test apparatus may analyze the digital test signal 803, so as to obtain an electrical test result related to the DC level test signal of the sending terminal circuit 810 of the chip 800.

In the analog signal test mode, when the signal sending unit 811 outputs a first analog test signal 801', the first input terminal of the unit gain buffer 821 receives the first analog test signal 801' through the second terminal of the first resistor 822. The output terminal of the unit gain buffer 822 outputs a second analog test signal 802' to the input terminal of the buffer 825. Herein, the output terminal of the rail-to-rail unit gain buffer 821 may output the second analog test signal 802' exhibiting low noise and good linearity characteristics. The output terminal of the buffer 725 outputs a third analog test signal 803' to the signal bump 830. In this embodiment, the signal bump 830 may be coupled to an external signal test device, so that the external signal test device may receive the third analog test signal 803' for signal analysis, so as to obtain an electrical test result related to the analog signal of the sending terminal circuit 810 of the chip 800.

In the leakage current test mode, when a control terminal of the switch circuit 826 receives a control signal 801" and is turned on, the first input terminal of the unit gain buffer 821 receives a first leakage current signal 802" through the second terminal of the first resistor 822. Further, note that the first leakage current signal 802" refers to a cross-voltage result generated by a leakage current flowing from the circuit node N1 through the switch circuit 826 and the second resistor 827 on the second resistor 827. The output terminal of the unit gain buffer 821 outputs a second leakage current signal 803" to the input terminal of the analog-to-digital converter 824. Herein, the output terminal of the rail-to-rail unit gain buffer 821 may output the second leakage current signal 803" exhibiting low noise and good linearity characteristics. An output terminal of the analog-to-digital converter 824 outputs a second digital test signal 804". In this embodiment, the analog-to-digital converter 824 may convert the analog second leakage current signal 803" into the second digital test signal 804", so that the related processing circuit in the chip 800 or an external signal test device may analyze the second digital test signal 804", so as to obtain an electrical test result related to the leakage current of the sending terminal circuit 810 of the chip 800.

The specific implementation of the DC level test mode may be found with reference to the description of the embodiments of FIG. 1 and FIG. 2, the specific implementation of the analog signal test mode may be found with reference to the description of the embodiments of FIG. 3 and FIG. 4, specific implementation of the leakage current test mode may be found with reference to the description of the embodiments of FIG. 5 and FIG. 6, and description thereof is thus not repeated herein.

In view of the foregoing, in the chip and the chip testing method provided by the disclosure, the test circuit may be arranged to be disposed at the signal sending terminal in the chip, so that the test circuit may perform related electrical testing during the design for testability process of the chip in the manufacturing process. In this way, the probe of an external test device is not required to be adopted to contact and test the signal bumps of the sending terminal circuit of the chip. Therefore, in the chip and the chip testing method provided by the disclosure, the area requirement of the arrangement of the signal bumps at the signal sending terminal of the chip may be effectively lowered, the influence of parasitic capacitance may be reduced, and the signal transmission speed of the chip may be further improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A chip, comprising:
 a sending terminal circuit, comprising:
  a signal sending unit; and
  a first signal bump, coupled to the signal sending unit; and
 a test circuit, coupled to a circuit node between the signal sending unit and the first signal bump, the test circuit comprising:
  a first resistor, wherein a first terminal of the first resistor is coupled to the circuit node;
  a unit gain buffer, wherein a first input terminal of the unit gain buffer is coupled to a second terminal of the first resistor, and a second input terminal of the unit gain buffer is coupled to an output terminal of the unit gain buffer; and
  an analog-to-digital converter, wherein an input terminal of the analog-to-digital converter is coupled to the output terminal of the unit gain buffer.

2. The chip according to claim 1, wherein the first input terminal of the unit gain buffer receives a first direct current (DC) level test signal through the second terminal of the first resistor when the signal sending unit outputs the first direct current level test signal,
 wherein the output terminal of the unit gain buffer outputs a second direct current level test signal to the input terminal of the analog-to-digital converter, so that an output terminal of the analog-to-digital converter outputs a first digital test signal.

3. The chip according to claim 1, wherein the test circuit further comprises:
 a buffer, wherein an input terminal of the buffer is coupled to the output terminal of the unit gain buffer, and an output terminal of the buffer is coupled to a second signal bump.

4. The chip according to claim 3, wherein the first input terminal of the unit gain buffer receives a first analog test signal through the second terminal of the first resistor when the signal sending unit outputs the first analog test signal,
 wherein the output terminal of the unit gain buffer outputs a second analog test signal to the input terminal of the buffer, so that the output terminal of the buffer outputs a third analog test signal to the second signal bump.

5. The chip according to claim 3, wherein the second signal bump is coupled to a general purpose input output pin of the chip.

6. The chip according to claim 3, wherein the test circuit further comprises:

a switch circuit, wherein a first terminal of the switch circuit is coupled to the second terminal of the first resistor; and a second resistor, wherein a first terminal of the second resistor is coupled to a second terminal of the switch circuit, and a second terminal of the second resistor is coupled to a first reference voltage.

7. The chip according to claim 6, wherein the first input terminal of the unit gain buffer receives a first leakage current signal through the second terminal of the first resistor when a control terminal of the switch circuit receives a control signal and is turned on, wherein the output terminal of the unit gain buffer outputs a second leakage current signal to the input terminal of the analog-to-digital converter, so that an output terminal of the analog-to-digital converter outputs a second digital test signal.

8. The chip according to claim 6, wherein the switch circuit is a switch transistor.

9. The chip according to claim 1, wherein the test circuit further comprises:

a switch circuit, wherein a first terminal of the switch circuit is coupled to the second terminal of the first resistor; and a second resistor, wherein a first terminal of the second resistor is coupled to a second terminal of the switch circuit, and a second terminal of the second resistor is coupled to a first reference voltage.

10. The chip according to claim 9, wherein the first input terminal of the unit gain buffer receives a first leakage current signal through the second terminal of the first resistor when a control terminal of the switch circuit receives a control signal and is turned on, wherein the output terminal of the unit gain buffer outputs a second leakage current signal to the input terminal of the analog-to-digital converter, so that an output terminal of the analog-to-digital converter outputs a second digital test signal.

11. The chip according to claim 10, wherein the switch circuit is a switch transistor.

12. The chip according to claim 1, wherein the test circuit further comprises:

a capacitor, wherein a first terminal of the capacitor is coupled to the second terminal of the first resistor, and a second terminal of the capacitor is coupled to a second reference voltage.

13. The chip according to claim 1, wherein a first output terminal of the signal sending unit is coupled to the first signal bump through the circuit node, and a second output terminal of the signal sending unit is coupled to another first signal bump through another circuit node, wherein the chip further comprises another test circuit, and the another test circuit is coupled to the another circuit node.

14. The chip according to claim 13, wherein the signal sending unit outputs a differential test signal or a common mode test signal through the first output terminal and the second output terminal when the test circuit and the another test circuit perform test operations.

15. The chip according to claim 1, wherein a number of the first signal bump is one or more.

16. A chip testing method, wherein the chip comprises a sending terminal circuit and a test circuit, the sending terminal circuit comprises a signal sending unit and a first signal bump, the signal sending unit is coupled to the first signal bump, the test circuit is coupled to a circuit node between the signal sending unit and the first signal bump, the test circuit comprises a first resistor, a unit gain buffer, and an analog-to-digital converter, a first terminal of the first resistor is coupled to the circuit node, a first input terminal of the unit gain buffer is coupled to a second terminal of the first resistor, a second input terminal of the unit gain buffer is coupled to an output terminal of the unit gain buffer, an input terminal of the analog-to-digital converter is coupled to the output terminal of the unit gain buffer, and the chip testing method comprises:

receiving, by the first input terminal of the unit gain buffer, a first direct current (DC) level test signal through the second terminal of the first resistor when the signal sending unit outputs the first direct current level test signal;

outputting, by the output terminal of the unit gain buffer, a second direct current level test signal to the input terminal of the analog-to-digital converter; and outputting, by an output terminal of the analog-to-digital converter, a first digital test signal.

17. The chip testing method according to claim 16, wherein the test circuit further comprises a buffer, an input terminal of the buffer is coupled to the output terminal of the unit gain buffer, an output terminal of the buffer is coupled to a second signal bump, and the chip testing method further comprises:

receiving, by the first input terminal of the unit gain buffer, a first analog test signal through the second terminal of the first resistor when the signal sending unit outputs the first analog test signal;

outputting, by the output terminal of the unit gain buffer, a second analog test signal to the input terminal of the buffer; and outputting, by the output terminal of the buffer, a third analog test signal to the second signal bump.

18. The chip testing method according to claim 17, wherein the test circuit further comprises a switch circuit and a second resistor, a first terminal of the switch circuit is coupled to the second terminal of the first resistor, a first terminal of the second resistor is coupled to a second terminal of the switch circuit, a second terminal of the second resistor is coupled to a first reference voltage, and the chip testing method further comprises:

receiving, by the first input terminal of the unit gain buffer, a first leakage current signal through the second terminal of the first resistor when a control terminal of the switch circuit receives a control signal and is turned on;

outputting, by the output terminal of the unit gain buffer, a second leakage current signal to the input terminal of the analog-to-digital converter; and outputting, by an output terminal of the analog-to-digital converter, a second digital test signal.

19. The chip testing method according to claim 16, wherein the test circuit further comprises a switch circuit and a second resistor, a first terminal of the switch circuit is coupled to the second terminal of the first resistor, a first terminal of the second resistor is coupled to a second terminal of the switch circuit, a second terminal of the second resistor is coupled to a first reference voltage, and the chip testing method further comprises:

receiving, by the first input terminal of the unit gain buffer, a first leakage current signal through the second terminal of the first resistor when a control terminal of the switch circuit receives a control signal and is turned on;

outputting, by the output terminal of the unit gain buffer, a second leakage current signal to the input terminal of the analog-to-digital converter; and outputting, by an output terminal of the analog-to-digital converter, a second digital test signal.

20. The chip testing method according to claim 16, wherein a first output terminal of the signal sending unit is coupled to the first signal bump through the circuit node, and a second output terminal of the signal sending unit is coupled to another first signal bump through another circuit node, the chip further comprises another test circuit, the another test circuit is coupled to the another circuit node, and the chip testing method comprises:

outputting, by the signal sending unit, a differential test signal or a common mode test signal through the first output terminal and the second output terminal when the test circuit and the another test circuit perform test operations.

* * * * *